United States Patent [19]
Rauenbuehler

[11] 3,940,850
[45] Mar. 2, 1976

[54] METHOD OF MAKING ELECTRICAL CONTACTS

[75] Inventor: John A. Rauenbuehler, New Berlin, Wis.

[73] Assignee: Cutler-Hammer, Inc., Milwaukee, Wis.

[22] Filed: Feb. 27, 1975

[21] Appl. No.: 554,100

[52] U.S. Cl. ............... 29/630 C; 29/191.6; 29/423; 113/119; 228/170
[51] Int. Cl.² ......................................... H01R 9/00
[58] Field of Search .......... 29/630 C, 630 R, 191.6, 29/423, 630 B; 113/119; 83/39, 40, 55; 200/265, 266, 267, 263, 262; 228/170, 173, 171, 164, 141; 72/324, 330, 331, 336, 337, 338

[56] References Cited
UNITED STATES PATENTS

| | | | |
|---|---|---|---|
| 2,600,834 | 6/1952 | Blair | 83/40 |
| 2,649,525 | 8/1953 | Harvey | 29/630 C X |
| 3,516,157 | 6/1970 | Brown | 29/626 |

*Primary Examiner*—Carl E. Hall
*Assistant Examiner*—James R. Duzan
*Attorney, Agent, or Firm*—H. R. Rather; Wm. A. Autio

[57] ABSTRACT

A method of making electrical contacts of the type having a pair of disk-shaped contacts of precious metal secured to an electrically conductive base member. In this method, continuous flat silver strip is first preformed in a punch press to provide a series of disks left connected to one another at their opposite peripheral edges to afford sufficient stiffness for handling. A pair of these strips are then fed, while maintaining registration therebetween, concurrently with a continuous base member into a brazing or welding machine and are secured to one surface of the base member adjacent opposite edges thereof to form a continuous subassembly strip. This subassembly strip is then fed into a cut-off device with accurate registration so as to make cuts through the connection exactly between adjacent disks of directly opposite pairs thereof and through the base member to provide two round contacts spaced apart on a rectangular base member. These round contacts of diameter X require substantially less silver than square contacts having a side dimension X while providing an electrical life the same as the larger area square contacts. This method combines the advantages of the continuous attachment process with the economy of discrete contacts.

6 Claims, 5 Drawing Figures

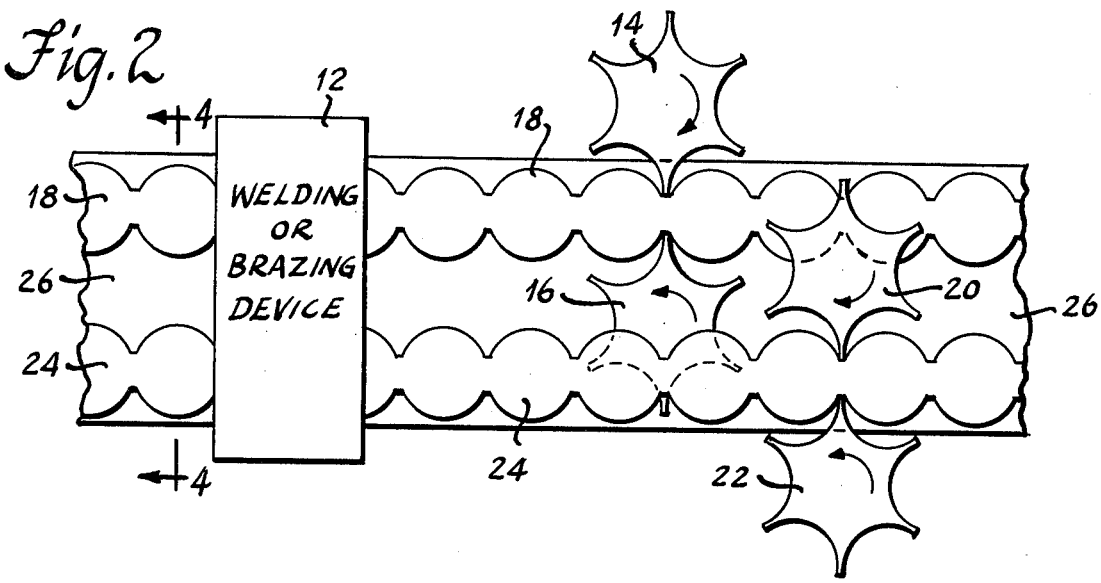
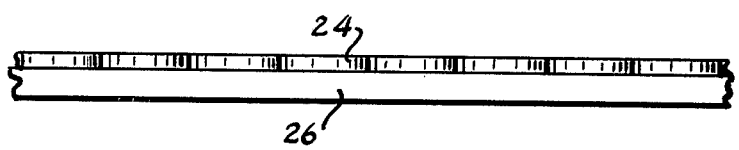
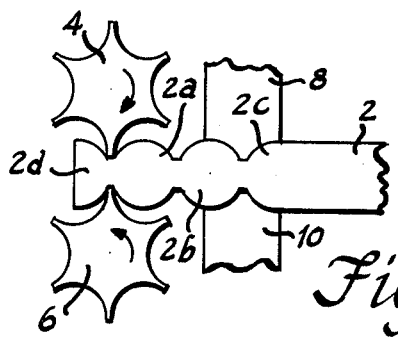
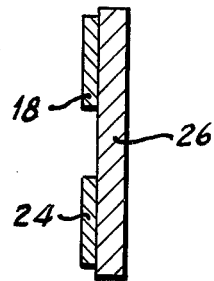
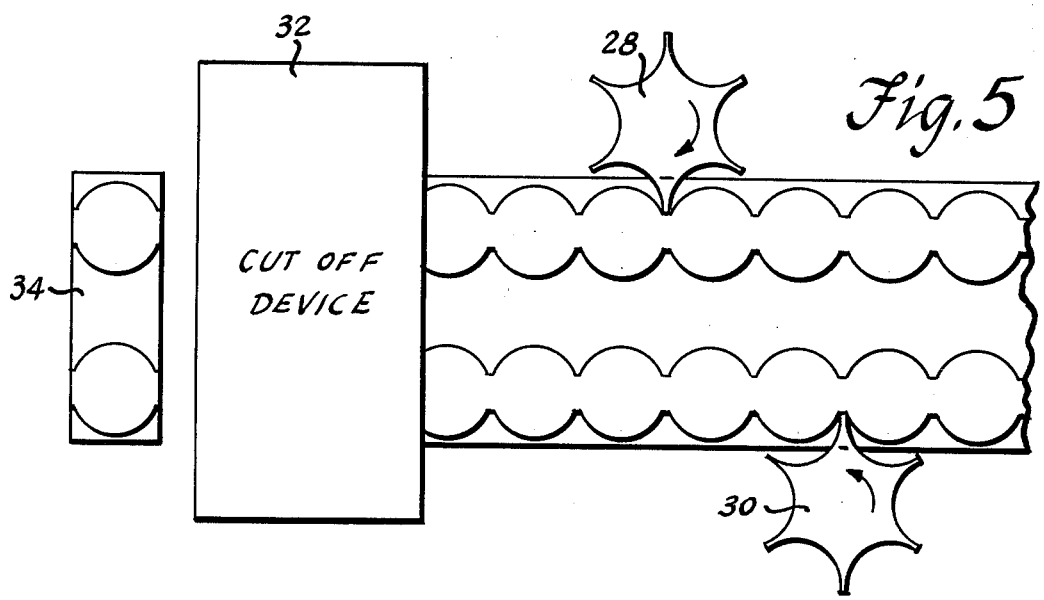

ical than handling and welding or resistance brazing discrete contacts. However, a disadvantage of this method is that it has been limited to making rectangular or square contacts, and, as a result, more silver is used than is necessary for the required performance. For example, the difference between a square contact and a round contact of the same diameter as the length of one side of the square contact is almost 22 percent in silver volume. That is, going from a square contact to a round contact of the same thickness and the above diameter results in a saving of almost 22 percent in the amount of silver. But round contacts have had the disadvantage that they are discrete contacts that require individual handling, thus requiring more complex and costly manufacturing methods.

METHOD OF MAKING ELECTRICAL CONTACTS

BACKGROUND OF THE INVENTION

A method of making electrical contacts from continuous strips has been known heretofore. In this method, one or two uniform strips of contact material are brazed near the edges of a strip of base material. Contacts are then chopped off this subassembly in a die. The greatest advantage of this method is that the attachment process is generally an unattended, continuous, automated operation and thus is more economical than handling and welding or resistance brazing discrete contacts. However, a disadvantage of this method is that it has been limited to making rectangular or square contacts, and, as a result, more silver is used than is necessary for the required performance. For example, the difference between a square contact and a round contact of the same diameter as the length of one side of the square contact is almost 22 percent in silver volume. That is, going from a square contact to a round contact of the same thickness and the above diameter results in a saving of almost 22 percent in the amount of silver. But round contacts have had the disadvantage that they are discrete contacts that require individual handling, thus requiring more complex and costly manufacturing methods.

While these prior methods have been useful for their intended purpose, this invention relates to improvements thereover.

SUMMARY OF THE INVENTION

An object of the invention is to provide an improved method of making electrical contacts.

A more specific object of the invention is to provide an improved method of making electrical contacts that combines the advantages of a continuous attachment process with the economy of material and durability afforded by formed discrete contacts.

Another specific object of the invention is to provide an improved method whereby round contacts in continuous strip form are fed and attached to a base member.

Another specific object of the invention is to provide an improved method of making electrical contacts whereby two strips of round contacts are fed in accurately controlled registration and secured to a base member whereafter such subassembly is closely registered to enable cutting precisely between contacts of opposite pairs thereof.

A further specific object of the invention is to provide an improved method of making round contacts secured to a base member whereby the round contacts are handled in continuous strip form prior to final cutting apart.

Other objects and advantages of the invention will hereinafter appear.

BRIEF DESCRIPTION OF THE DRAWINGS

FIG. 1 shows a top view of a punch press including means for moving and punching contact material into a preformed strip of round contacts;

FIG. 2 is an enlarged top view of means for feeding two preformed strips of round contacts simultaneously with a base strip into a welding or brazing device wherein the contact strips are accurately registered and attached to the base strip;

FIG. 3 is an edge view of the subassembly of contact strips and base member made in FIG. 2;

FIG. 4 is a cross-sectional view of the subassembly taken along line 4—4 of FIG. 2; and FIG. 5 is a top view of means for feeding the subassembly of FIGS. 2–4 into a cutoff device and cutting precisely between the round contacts.

DESCRIPTION OF THE PREFERRED EMBODIMENT

Referring to FIG. 1, there is shown a uniform strip of contact material 2 such as silver or silver cadmium oxide being fed into a punch press. This punch press comprises a pair of intermittently driven feed sprockets 4 and 6 and a punch die having a rear half 8 and a front half 10.

As shown in FIG. 1, each half of the die, 8 and 10, is shaped so that it will form the corresponding side of the strip. That is, each half of the die will cut the removable material from between two adjacent contacts, thus forming one quarter of the circumference of each adjacent contact. Thus, the two dies together form one-half of the circumference of each of the two adjacent contacts. As shown in FIG. 1, the dies are shaped to extend around slightly past the half-way points on the adjacent contacts to insure that the cut-off material will be completely severed. With this shape of die, a first punching operation will form the leading half of the first contact 2a, the strip is then advanced whereupon the second punching operation will form the trailing half of the first contact 2a and the leading half of the second contact 2b, the strip is again advanced whereupon the third punching operation will form the trailing half of the second contact and the leading half of the third contact 2c, etc.

For an initial set-up preparatory to running the punch press, it is first necessary to make a few punches from the end of the strip under manual control. This will enable the strip to be inserted between feed sprocket wheels or star wheels 4 and 6. As shown in FIG. 1, the first punch has been made at the leading end of the strip so as to form a half contact 2d that must be trimmed off later. To avoid such waste, the first punch can be made so as to form the leading half of the first contact, thus requiring three punches under manual control rather than two as in FIG. 1 to reach the star wheels. The number of punches required under manual control will, of course, depend on the configuration of the machine and the distance between the feeding star wheels and the die.

Once the punch press has been set up as shown in FIG. 1, it can be run automatically to form the strip. In this operation, the die is raised, the star wheels will rotate one-sixth revolution in the direction indicated by the arrows to advance the silver or silver cadmium oxide strip and precisely position it for the next punch, and then the die comes down to make the punch. This operation repeats until the long continuous strip is formed.

As will be apparent, the round contacts 2a, 2b, 2c are left attached to one another at their opposite peripheral edges enough to provide sufficient strength and stiffness for handling. The die is shaped so that a straight cut later between adjacent contacts will provide as close to round contacts as possible.

After contact strips have been preformed as shown in FIG. 1, a pair of such contact strips are attached to a base member as shown in FIG. 2. For this purpose, there are provided a welding or brazing device 12, a first pair of feeding star wheels 14 and 16 for feeding rear strip 18, a second pair of feeding star wheels 20 and 22 for feeding front strip 24, and suitable feeding means such as drive rolls (not shown) for feeding base member 26. The four sprocket wheels or star wheels 14, 16, 20 and 22 are geared together and the two pairs thereof are spaced apart a multiple of contact widths, two contact widths in FIG. 2, thereby to register the two strips relative to one another so that the tangential line between adjacent contacts in one strip coincides exactly with the tangential line between adjacent contacts in the other strip.

For mechanical reasons, the aforesaid strips and base member are fed at different levels. That is, star wheels 20 and 22 and contact strip 24 are above star wheels 14 and 16 and contact strip 18. Also, base member 26 is therebelow. Thus, there are provided pincher rollers (not shown) in the brazing zone, preferably ahead of device 12, for bringing both contact strips 18 and 24 down against the upper surface of base strip 26 to be attached thereto by brazing or welding. When the subassembly leaves the left hand side of device 12, the two contact strips are rigidly and electrical conductively secured to base member 26 as shown in FIGS. 3 and 4.

The final step of the method, cutting or chopping the subassembly into finished contacts, is shown in FIG. 5. For this purpose, there are provided two star wheels 28 and 30, like star wheels 14 and 22 in FIG. 2, except that they are on the same level, for feeding the subassembly, produced in FIG. 2, into a cut off device 32. These star wheels 28 and 30 are geared together and may be similarly spaced as in FIG. 2, to feed the brazed subassembly into the cut off device. This cut off device includes a shear, die or the like for making a straight cut transversely across the subassembly exactly between contacts to produce finished contacts 34 shown in FIG. 5. Star wheels 28 and 30 rotate intermittently one-sixth revolution in the direction of the arrows between cut off device operations.

As shown at the left hand side of FIG. 5, finished contacts 34 consist of two spaced apart disk contacts secured to a rectangular base member. These contacts are very nearly round. A typical use of the finished contact is for bridging a pair of stationary contacts in an electrical switch or relay.

These round contacts of a diameter equal to the side dimension of square contacts will afford the same electrical life as the square contacts. This is because round contacts do not have loose corners to lift up or peel. The action of the arc leaving a round contact is more random than an arc which tends to leave a square or rectangular contact by the corners. Although the "jog" life which appears to be proportional to the amount of contact material would be reduced, nevertheless the electrical life would remain substantially the same, while taking advantage of the continuous, automated attachment process along with the economy of material in round contacts.

While the method hereinbefore described is effectively adapted to fulfill the objects stated, it is to be understood that the invention is not intended to be confined to the particular preferred method of making electrical contacts disclosed, inasmuch as it is susceptible of various modifications without departing from the scope of the appended claims.

I claim:

1. A method of making electrical contacts comprising the steps of:
    pre-forming a flat uniform continuous strip into a multiple-contact strip having a series of contact disks partially left connected to one another at their adjacent peripheral edges through a narrow integral connecting part sufficiently strong to provide adequate stiffness for mechanical feeding while providing substantially round contacts when a tangential cut is made through the connecting part between each pair of contact disks, said strip consisting of good electrical conducting material such as precious metal or the like;
    forming a continuous base strip of electrical conducting material;
    simultaneously feeding the two strips contiguously into a connecting device and therein rigidly securing the multiple-contact strip to the base strip to provide a combined strip from which electrical contacts may be cut off;
    feeding said combined strip into a cutting device with accurate registration of said narrow connecting part with respect to the cutter;
    and operating said cutting device to make a tangential cut, centered between adjacent disks, through said combined strip.

2. The method of making electrical contacts claimed in claim 1, wherein said step of simultaneously feeding the two strips contiguously into a connecting device and therein rigidly securing the multiple-contact strip to the base strip to provide a combined strip from which electrical contacts may be cut off comprises:
    passing said two strips through pinching rolls to press said multiple-contact strip against the surface of said base strip and then brazing the two strips together.

3. The method of making electrical contacts claimed in claim 1, wherein said preforming step comprises:
    intermittently feeding said flat uniform continuous strip;
    and punching said strip between said intermittent feeding motions to form said interconnected series of contact disks thereon.

4. A method of making electrical contacts comprising the steps of:
    preforming flat uniform strips of contact material into multiple-contact strips having a series of contact disks left connected to one another at their adjacent peripheral edges through a narrow integral connecting part sufficiently strong to provide adequate stiffness for mechanical feeding while providing substantially round contacts when a tangential cut is made through the connecting part between each pair of contact disks, said strip consisting of good electrical conducting material such as precious metal or the like;
    forming a flat uniform elongated base member of electrical conducting material;
    simultaneously feeding a plurality of said multiple-contact strips in spaced apart relation to one another along with said base member into a connecting device and therein rigidly securing said multiple-contact strips to the flat surface adjacent the opposite edges of said base member to provide a subassembly strip from which electrical bridging contacts may be cut off;
    feeding said subassembly strip into a cutting device;

and actuating said cutting device to make lateral cuts between contact disks of opposite pairs thereof through said subassembly strip to provide contacts having a pair of spaced contact disks on a rectangular base member.

5. The method of making electrical contacts claimed in claim 4, wherein said step of simultaneously feeding two of said multiple-contact strips comprises:

maintaining said multiple-contact strips in accurate registration with respect to one another so that the transverse line between adjacent contact disks on each of said strips coincides precisely with the transverse line between corresponding contact disks on any other strip as said strips are fed into said connecting device and securing said multiple-contact strips to said base member in such registration.

6. The method of making electrical contacts claimed in claim 4, wherein said step of feeding said subassembly strip into said cutting device comprises:

intermittently feeding said subassembly strip and accurately stopping the same between motions with respect to said cutting device so that said lateral cuts are made exactly between said contact disks to provide contacts that are as round as possible.

* * * * *